United States Patent
Monat et al.

(10) Patent No.: US 8,326,246 B2
(45) Date of Patent: *Dec. 4, 2012

(54) SUPER REGENERATIVE (SR) APPARATUS HAVING PLURALITY OF PARALLEL SR AMPLIFIERS TUNED TO DISTINCT FREQUENCIES

(75) Inventors: Pavel Monat, San Diego, CA (US); David Jonathan Julian, San Diego, CA (US); Robert Keith Douglas, San Diego, CA (US); Prasad S. Gudem, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1005 days.

This patent is subject to a terminal disclaimer.

(21) Appl. No.: 11/775,786

(22) Filed: Jul. 10, 2007

(65) Prior Publication Data

US 2009/0016548 A1  Jan. 15, 2009

(51) Int. Cl.
*H04B 7/00* (2006.01)
(52) U.S. Cl. ............ 455/130; 455/336; 342/51
(58) Field of Classification Search ........... 455/41.1, 455/41.2, 63.1, 67.11, 91, 106, 130, 205, 455/324, 336; 342/42, 43, 44, 51
See application file for complete search history.

(56) References Cited

U.S. PATENT DOCUMENTS

| | | | |
|---|---|---|---|
| 2,614,216 A * | 10/1952 | Tellier | 455/215 |
| 4,123,715 A | 10/1978 | Fathauer | |
| 4,754,255 A | 6/1988 | Sanders et al. | |
| 5,548,821 A | 8/1996 | Coveley | |
| 5,608,724 A | 3/1997 | Green, Jr. | |
| 5,621,756 A * | 4/1997 | Bush et al. | 375/219 |
| 5,630,216 A | 5/1997 | McEwan | |
| 5,687,169 A | 11/1997 | Fullerton | |
| 5,742,902 A * | 4/1998 | Shore | 455/336 |
| 5,751,197 A | 5/1998 | Boling, III | |
| 5,764,696 A | 6/1998 | Barnes et al. | |
| 5,812,081 A | 9/1998 | Fullerton | |
| 5,832,035 A | 11/1998 | Fullerton | |

(Continued)

FOREIGN PATENT DOCUMENTS

CN   1425223 A   6/2003

(Continued)

OTHER PUBLICATIONS

Pelissier, M. et al: "A new pulse detector based on super-regeneration for UWB low power applications", pp. 639-644, IEEE (2006).

(Continued)

*Primary Examiner* — Nhan Le
(74) *Attorney, Agent, or Firm* — Dang M. Vo; Paul S. Holdaway (57) ABSTRACT

An apparatus, which may be configured as a receiver or transceiver, includes a plurality of super regenerative (SR) amplifiers coupled in parallel, wherein the SR amplifiers are tuned to distinct frequency bands, respectively. The apparatus may further include isolation amplifiers at the respective inputs and outputs of the SR amplifiers to prevent injection locking and reduce power leakage. The apparatus may include a circuit to reduce or substantially eliminate in-band jamming signals. The apparatus may form at least part of a wireless communications device adapted to receive signals from other wireless communications devices, adapted to transmit signal to other wireless communications devices, and adapted to both transmit and receive signals to and from other wireless communications devices.

49 Claims, 9 Drawing Sheets

U.S. PATENT DOCUMENTS

| | | | |
|---|---|---|---|
| 5,907,427 A | 5/1999 | Scalora et al. | |
| 5,907,799 A * | 5/1999 | Morey | 455/336 |
| 5,952,956 A | 9/1999 | Fullerton | |
| 5,960,031 A | 9/1999 | Fullerton et al. | |
| 5,963,581 A | 10/1999 | Fullerton et al. | |
| 5,969,663 A | 10/1999 | Fullerton et al. | |
| 5,995,534 A | 11/1999 | Fullerton et al. | |
| 6,031,862 A | 2/2000 | Fullerton et al. | |
| 6,091,374 A | 7/2000 | Barnes | |
| 6,111,536 A | 8/2000 | Richards et al. | |
| 6,133,876 A | 10/2000 | Fullerton et al. | |
| 6,177,903 B1 | 1/2001 | Fullerton et al. | |
| 6,218,979 B1 | 4/2001 | Barnes et al. | |
| 6,295,019 B1 | 9/2001 | Richards et al. | |
| 6,297,773 B1 | 10/2001 | Fullerton et al. | |
| 6,300,903 B1 | 10/2001 | Richards et al. | |
| 6,304,623 B1 | 10/2001 | Richards et al. | |
| 6,351,652 B1 | 2/2002 | Finn et al. | |
| 6,354,946 B1 | 3/2002 | Finn | |
| 6,400,307 B2 | 6/2002 | Fullerton et al. | |
| 6,400,329 B1 | 6/2002 | Barnes | |
| 6,421,389 B1 | 7/2002 | Jett et al. | |
| 6,430,208 B1 | 8/2002 | Fullerton et al. | |
| 6,437,756 B1 | 8/2002 | Schantz | |
| 6,462,701 B1 | 10/2002 | Finn | |
| 6,466,125 B1 | 10/2002 | Richards et al. | |
| 6,469,628 B1 | 10/2002 | Richards et al. | |
| 6,483,461 B1 | 11/2002 | Matheney et al. | |
| 6,487,264 B1 | 11/2002 | Alley et al. | |
| 6,489,893 B1 | 12/2002 | Richards et al. | |
| 6,492,904 B2 | 12/2002 | Richards | |
| 6,492,906 B1 | 12/2002 | Richards et al. | |
| 6,501,393 B1 | 12/2002 | Richards et al. | |
| 6,504,483 B1 | 1/2003 | Richards et al. | |
| 6,512,455 B2 | 1/2003 | Finn et al. | |
| 6,512,488 B2 | 1/2003 | Schantz | |
| 6,519,464 B1 | 2/2003 | Santhoff et al. | |
| 6,529,568 B1 | 3/2003 | Richards et al. | |
| 6,538,615 B1 | 3/2003 | Schantz | |
| 6,539,213 B1 | 3/2003 | Richards et al. | |
| 6,549,567 B1 | 4/2003 | Fullerton | |
| 6,552,677 B2 | 4/2003 | Barnes et al. | |
| 6,556,621 B1 | 4/2003 | Richards et al. | |
| 6,560,463 B1 | 5/2003 | Santhoff | |
| 6,571,089 B1 | 5/2003 | Richards et al. | |
| 6,573,857 B2 | 6/2003 | Fullerton et al. | |
| 6,577,691 B2 | 6/2003 | Richards et al. | |
| 6,585,597 B2 | 7/2003 | Finn | |
| 6,593,886 B2 | 7/2003 | Schantz | |
| 6,606,051 B1 | 8/2003 | Fullerton et al. | |
| 6,611,234 B2 | 8/2003 | Fullerton et al. | |
| 6,614,384 B2 | 9/2003 | Hall et al. | |
| 6,621,462 B2 | 9/2003 | Barnes | |
| 6,636,566 B1 | 10/2003 | Roberts et al. | |
| 6,636,567 B1 | 10/2003 | Roberts et al. | |
| 6,636,573 B2 | 10/2003 | Richards et al. | |
| 6,642,903 B2 | 11/2003 | Schantz | |
| 6,661,342 B2 | 12/2003 | Hall et al. | |
| 6,667,724 B2 | 12/2003 | Barnes et al. | |
| 6,670,909 B2 | 12/2003 | Kim | |
| 6,671,310 B1 | 12/2003 | Richards et al. | |
| 6,674,396 B2 | 1/2004 | Richards et al. | |
| 6,677,796 B2 | 1/2004 | Brethour et al. | |
| 6,700,538 B1 | 3/2004 | Richards | |
| 6,710,736 B2 | 3/2004 | Fullerton et al. | |
| 6,717,992 B2 | 4/2004 | Cowie et al. | |
| 6,748,040 B1 | 6/2004 | Johnson et al. | |
| 6,750,757 B1 | 6/2004 | Gabig, Jr. et al. | |
| 6,759,948 B2 | 7/2004 | Grisham et al. | |
| 6,760,387 B2 | 7/2004 | Langford et al. | |
| 6,762,712 B2 | 7/2004 | Kim | |
| 6,763,057 B1 | 7/2004 | Fullerton et al. | |
| 6,763,282 B2 | 7/2004 | Glenn et al. | |
| 6,774,846 B2 | 8/2004 | Fullerton et al. | |
| 6,774,859 B2 | 8/2004 | Schantz et al. | |
| 6,778,603 B1 | 8/2004 | Fullerton et al. | |
| 6,781,530 B2 | 8/2004 | Moore | |
| 6,782,048 B2 | 8/2004 | Santhoff | |
| 6,788,730 B1 | 9/2004 | Richards et al. | |
| 6,822,604 B2 | 11/2004 | Hall et al. | |
| 6,823,022 B1 | 11/2004 | Fullerton et al. | |
| 6,836,223 B2 | 12/2004 | Moore | |
| 6,836,226 B2 | 12/2004 | Moore | |
| 6,845,253 B1 | 1/2005 | Schantz | |
| 6,847,675 B2 | 1/2005 | Fullerton et al. | |
| 6,879,878 B2 | 4/2005 | Glenn et al. | |
| 6,882,301 B2 | 4/2005 | Fullerton | |
| 6,895,034 B2 | 5/2005 | Nunally et al. | |
| 6,900,732 B2 | 5/2005 | Richards | |
| 6,906,625 B1 | 6/2005 | Taylor et al. | |
| 6,907,244 B2 | 6/2005 | Santhoff et al. | |
| 6,912,240 B2 | 6/2005 | Kumar et al. | |
| 6,914,949 B2 | 7/2005 | Richards et al. | |
| 6,915,146 B1 * | 7/2005 | Nguyen et al. | 455/702 |
| 6,917,284 B2 | 7/2005 | Grisham et al. | |
| 6,919,838 B2 | 7/2005 | Santhoff | |
| 6,922,166 B2 | 7/2005 | Richards et al. | |
| 6,922,177 B2 | 7/2005 | Barnes et al. | |
| 6,925,109 B2 | 8/2005 | Richards et al. | |
| 6,933,882 B2 | 8/2005 | Fullerton | |
| 6,937,639 B2 | 8/2005 | Pendergrass et al. | |
| 6,937,663 B2 | 8/2005 | Jett et al. | |
| 6,937,667 B1 | 8/2005 | Fullerton et al. | |
| 6,937,674 B2 | 8/2005 | Santhoff et al. | |
| 6,947,492 B2 | 9/2005 | Santhoff et al. | |
| 6,950,485 B2 | 9/2005 | Richards et al. | |
| 6,954,480 B2 | 10/2005 | Richards et al. | |
| 6,959,031 B2 | 10/2005 | Haynes et al. | |
| 6,959,032 B1 | 10/2005 | Richards et al. | |
| 6,963,727 B2 | 11/2005 | Shreve | |
| 6,980,613 B2 | 12/2005 | Krivokapic | |
| 6,989,751 B2 | 1/2006 | Richards | |
| 7,015,793 B2 | 3/2006 | Gabig, Jr. et al. | |
| 7,020,224 B2 | 3/2006 | Krivokapic | |
| 7,027,425 B1 | 4/2006 | Fullerton et al. | |
| 7,027,483 B2 | 4/2006 | Santhoff et al. | |
| 7,027,493 B2 | 4/2006 | Richards | |
| 7,030,806 B2 | 4/2006 | Fullerton | |
| 7,042,417 B2 | 5/2006 | Santhoff et al. | |
| 7,046,187 B2 | 5/2006 | Fullerton et al. | |
| 7,046,618 B2 | 5/2006 | Santhoff et al. | |
| 7,069,111 B2 | 6/2006 | Glenn et al. | |
| 7,075,476 B2 | 7/2006 | Kim | |
| 7,079,827 B2 | 7/2006 | Richards et al. | |
| 7,099,367 B2 | 8/2006 | Richards et al. | |
| 7,099,368 B2 | 8/2006 | Santhoff et al. | |
| 7,129,886 B2 | 10/2006 | Hall et al. | |
| 7,132,975 B2 | 11/2006 | Fullerton et al. | |
| 7,145,954 B1 | 12/2006 | Pendergrass et al. | |
| 7,148,791 B2 | 12/2006 | Grisham et al. | |
| 7,151,490 B2 | 12/2006 | Richards | |
| 7,167,525 B2 | 1/2007 | Santhoff et al. | |
| 7,170,408 B2 | 1/2007 | Taylor et al. | |
| 7,184,938 B1 | 2/2007 | Lansford et al. | |
| 7,190,722 B2 | 3/2007 | Lakkis et al. | |
| 7,190,729 B2 | 3/2007 | Siwiak | |
| 7,206,334 B2 | 4/2007 | Siwiak | |
| 7,209,724 B2 | 4/2007 | Richards et al. | |
| 7,230,980 B2 | 6/2007 | Langford et al. | |
| 7,239,277 B2 | 7/2007 | Fullerton et al. | |
| RE39,759 E | 8/2007 | Fullerton | |
| 7,256,727 B2 | 8/2007 | Fullerton et al. | |
| 7,271,779 B2 | 9/2007 | Hertel | |
| 2002/0168957 A1 * | 11/2002 | Mapes | 455/336 |
| 2003/0139158 A1 | 7/2003 | Kan | |
| 2005/0069051 A1 | 3/2005 | Lourens | |
| 2006/0084469 A1 * | 4/2006 | Malone et al. | 455/552.1 |

FOREIGN PATENT DOCUMENTS

| | | |
|---|---|---|
| JP | 1137710 A | 5/1989 |
| JP | 4082304 A | 3/1992 |
| JP | 9121200 A | 5/1997 |
| JP | 2001267864 A | 9/2001 |
| JP | 2004364068 A | 12/2004 |
| WO | WO0167625 A1 | 9/2001 |

OTHER PUBLICATIONS

Wang, C.P, et al: "Noise Figure and Sensitivity of a Superregenerative-Parametic Amplifier", IRE Transactions on Circuit Theory, pp. 320-328 (Dec. 1962).

Riebmen, Leon: "Theory of the Superregenerative Amplifier", Proceedings of the IRE, pp. 29-33 ,(Jan. 1949).

Otis, B. et al: "A 400uW-RX, 1.6mW-TX Super-Regenerative Transceiver for Wireless Sensor Networks", IEEE International Solid-State Circuits Conference, pp. 396-397, 606 (2005).

Vouilloz, A. et al: "A Low-power CMOS Super-Regenerative Receiver at 1 GHz", IEEE Journal of Solid-State Circuits, vol. 36, No. 3, pp. 440-451 (Mar. 2001).

International Search Report and Written Opinion—PCT/US2008/062302, International Search Authority—European Patent Office—Jun. 10, 2009.

Taiwan Search Report—TW097116509—TIPO—Nov. 2, 2011.

\* cited by examiner

SUPER REGENERATIVE (SR) APPARATUS HAVING PLURALITY OF PARALLEL SR AMPLIFIERS TUNED TO DISTINCT FREQUENCIES

BACKGROUND

1. Field

This disclosure relates generally to communications systems, and in particular, to a super regenerative (SR) apparatus including a plurality of SR amplifiers coupled in parallel and respectively tuned to distinct frequency bands.

2. Background

In the past, communications systems that receive information via ultra-wide band (UWB) channels employ receivers generally consisting of one or more cascaded linear amplifiers. However, when such receivers operate at a frequency range of, for example, several GHz or above, the one or more cascaded linear amplifiers generally consume a substantial amount of power. This may make this receiver architecture undesirable for low power applications, where the power source has a limited continued-use life, such as a battery.

Another drawback with the conventional UWB receiver is that the one or more cascaded linear amplifiers are typically not well suited to reject out-of-band jamming signals. Because of this drawback, conventional UWB receivers typically employ a band pass filter (BPF) between an antenna and the input of the one or more cascaded amplifiers, to reduce or eliminate out-of-band jamming signals. Generally, the BPF may be complicated in order to achieve the desired out-of-band rejection in order to effectively reduce or eliminate out-of-band jamming signals. This has the adverse consequences of increasing the costs associated with conventional UWB receivers. Furthermore, conventional UWB receivers including the one or more cascaded linear amplifiers are generally incapable of effectively reducing or eliminating in-band jamming signals.

SUMMARY

An aspect of the disclosure relates to an apparatus comprising a plurality of super regenerative (SR) amplifiers coupled in parallel, wherein the SR amplifiers are tuned to distinct frequency bands, respectively. In another aspect, the distinct frequency bands lie within a defined bandwidth. In yet another aspect, the number N of super regenerative amplifiers, the respective quality factors (Q) of the SR amplifiers, and the respective center frequencies of the distinct frequency bands are configured to provide a defined minimum gain, a defined gain ripple, or a defined frequency response across the defined bandwidth. In yet another aspect, one or more distinct frequency bands may overlap with another one or more distinct frequency bands.

According to another aspect of the disclosure, the apparatus may comprise a first set of isolations amplifiers situated at the respective inputs of the SR amplifiers. Additionally, the apparatus may comprise a second set of isolation amplifiers situated at the respective outputs of the SR amplifiers. The first and second sets of isolation amplifiers isolate the SR amplifiers from each other to prevent injection lock of one amplifier to another. Also, the first set of isolation amplifiers helps prevent power leakage from the SR amplifiers. The apparatus may include an antenna coupled to the inputs of the SR amplifiers for receiving a signal from a communications device. The apparatus may also include a summing device coupled to the outputs of the SR amplifiers to reconstruct the amplified received signal from the signals in the distinct frequency bands amplified by the respective SR amplifiers.

According to yet another aspect of the disclosure, the apparatus may further comprise a circuit adapted to determine whether a jamming signal is present in any of the distinct frequency bands covered by the respective SR amplifiers. In one aspect, the circuit may be adapted to disable one or more SR amplifiers pertaining respectively to one or more distinct frequency bands in which one or more jamming signals are present. In yet another aspect, the circuit may comprise a processor adapted to be controlled by executable codes.

According to still another aspect of the disclosure, the SR amplifiers may form at least a portion of a signal receiver or transceiver. In yet another aspect, the SR amplifiers may form at least a portion of a non-coherent receiver. In other aspects, the apparatus may form part of a wireless communications device adapted to receive audio data from a second wireless communications device via an antenna, and adapted to transmit audio data to the second wireless communications device via the antenna. In still another aspect, the apparatus may form part of a wireless communications device adapted to receive data from a second wireless communications device via an antenna, and process the received data. In still another aspect, the apparatus may form part of a wireless communications device including a sensor adapted to generate sensed data and a transceiver adapted to transmit the sensed data to another communications device via an antenna.

Other aspects, advantages and novel features of the present disclosure will become apparent from the following detailed description of the disclosure when considered in conjunction with the accompanying drawings.

DETAILED DESCRIPTION

Various aspects of the disclosure are described below. It should be apparent that the teachings herein may be embodied in a wide variety of forms and that any specific structure, function, or both being disclosed herein are merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

As an example of some of the above concepts, in some aspects, the apparatus may comprise a plurality of super regenerative (SR) amplifiers (also referred to as SR oscillators) coupled in parallel, wherein the SR amplifiers are tuned to distinct frequency bands, respectively. In other aspects, the apparatus may further include isolation amplifiers at the respective inputs and outputs of the SR amplifiers to prevent injection locking and reduce power leakage. In other aspects, the apparatus may include a circuit to reduce or substantially eliminate in-band jamming signals. In yet other aspects, the apparatus may form at least part of a receiver or transceiver. In still other aspects, the apparatus may form at least part of a wireless communications device adapted to receive signals from another wireless communications device, adapted to transmit signals to another wireless communications device, and adapted to both transmit and receive signals to and from another wireless communications device.

Figure 1A:
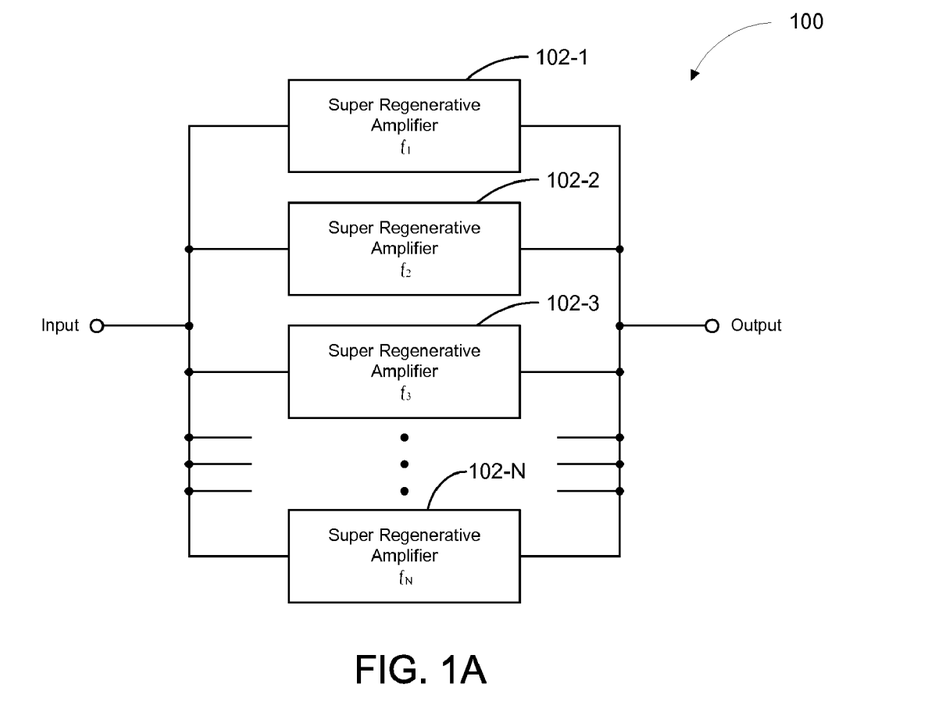
FIG. 1A illustrates a block diagram of an exemplary super regenerative (SR) apparatus in accordance with an aspect of the disclosure.

FIG. 1A illustrates a block diagram of an exemplary super regenerative (SR) apparatus 100 in accordance with an aspect of the disclosure. The SR apparatus 100 is capable of receiving a signal via an input, amplifying the signal via a plurality of parallel SR amplifiers tuned respectively to distinct frequency bands, and generating the amplified signal at an output. In its most typical application, the SR apparatus 100 may be used as a receiver as part of a wired or wireless communications device. However, it shall be understood that the SR apparatus 100 may also be used as part of a transceiver. As discussed in more detail below, the SR apparatus 100 is capable of effectively dealing with out-of-band jamming signals as well as in-band jamming signals.

More specifically, the SR apparatus 100 comprises a plurality of SR amplifiers 102-1 through 102-N coupled in parallel between an input and an output. In this example, the SR apparatus 100 has N number of SR amplifiers. Each of the SR amplifiers is tuned to a distinct frequency band. For example, SR amplifier 102-1 is tuned to a frequency band having a center frequency represented as f1, SR amplifier 102-2 is tuned to a frequency band having a center frequency represented as f2, and SR amplifier 102-N is tuned to a frequency band having a center frequency represented as fN.

Generally, the distinct frequency bands may reside within a defined bandwidth, such as an ultra-wide band (UWB) channel. For example, an ultra-wide band (UWB) channel may be defined as having a fractional bandwidth on the order of 20% or more, a bandwidth on the order of 500 MHz or more, or a fractional bandwidth on the order of 20% or more and a bandwidth on the order of 500 MHz or more. The number N of SR amplifiers, the respective quality factors (Q) of the SR amplifiers, and the respective center frequencies f1 to fN of the distinct frequency bands may be configured to provide a defined minimum gain, a defined gain ripple, or a defined frequency response across the defined bandwidth.

As discussed in more detail below, the SR apparatus 100 may be useful in eliminating or reducing out-of-band jamming signals as well as in-band jamming signals. For example, each SR amplifier, and in particular, the SR amplifiers at the ends of the defined bandwidth, such as SR amplifiers 102-1 and 102-N, may be configured to have a relatively high quality factor (Q). As such, the SR amplifier will have a relatively high gain near its center frequency, and high attenuation for frequencies relatively far from its center frequency. Thus, the SR amplifier may inherently attenuate jamming signals that may reside outside of the defined bandwidth, thereby providing substantial rejection or elimination of out-of-band jamming signals.

With regard to in-band jamming signals, the SR apparatus 100 may be configured with a relatively large number N of SR amplifiers. In such as case, each SR amplifier may amplify signals only within a relatively small sub-band within the defined bandwidth. Thus, if the jamming signal lies within one of the sub-bands, the corresponding SR amplifier may be turned off or disabled to prevent or reduce the presence of the jamming signal at the output of the SR apparatus 100. Since, as discussed above, the sub-band may be relatively small as compared to the defined bandwidth, the effect of turning off or disabling the SR amplifier corresponding to the jamming signal may be negligible or minimal to a broadband (e.g., UWB) signal being received and amplified by the SR apparatus 100.

Figure 1B:
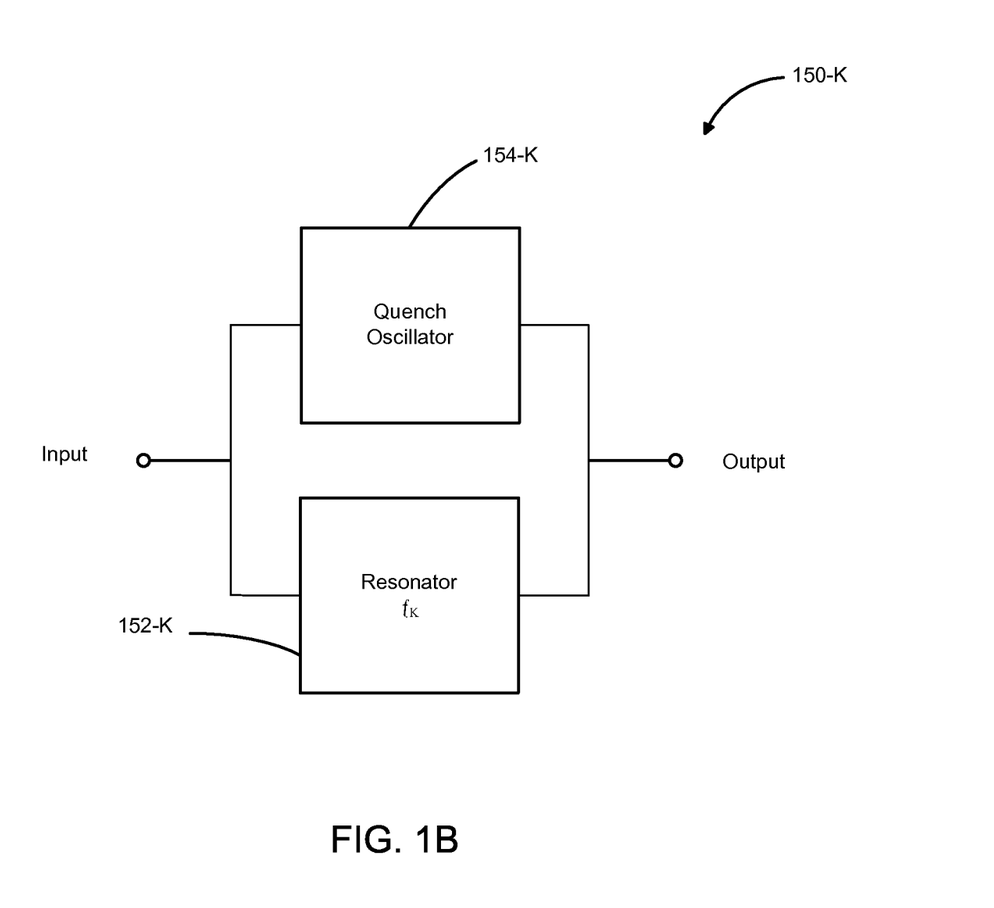
FIG. 1B illustrates a block diagram of an exemplary super regenerative (SR) amplifier in accordance with another aspect of the disclosure.

FIG. 1B illustrates a block diagram of an exemplary super regenerative (SR) amplifier 150-K in accordance with another aspect of the disclosure. The SR amplifier 150-K may be a detailed example of any SR amplifier described herein. The SR amplifier 150-K comprises a resonator 152-K and a quench oscillator 154-K. The resonator 152-K may comprise a tank circuit, a saw resonator, or others type of resonator. Each resonator may be tuned manually or electronically such as by an analog circuit or a digital circuit, such as a processor. The quench oscillator 154-K may be periodically quenched. The quench frequency may be at least twice the bandwidth of the defined bandwidth that the SR apparatus is designed to cover. Thus, if the defined bandwidth is between fa and fb, the quench frequency may be at least 2*(fb−fa).

Figure 2A:
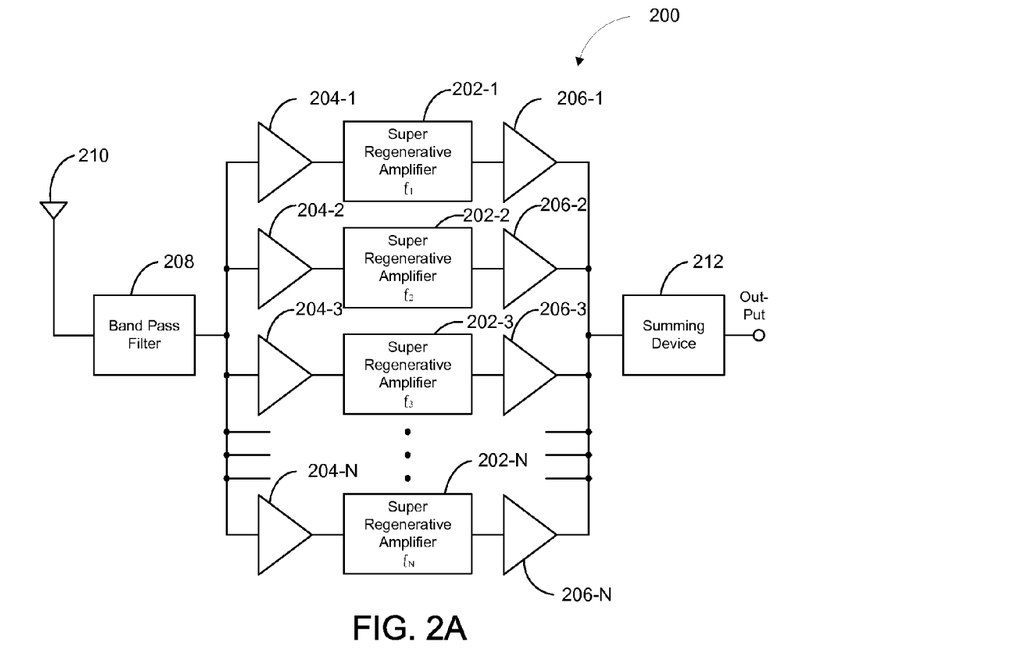
FIG. 2A illustrates a block diagram of an exemplary super regenerative (SR) receiver in accordance with another aspect of the disclosure.

FIG. 2A illustrates a block diagram of an exemplary super regenerative (SR) receiver 200 in accordance with another aspect of the disclosure. The SR receiver 200 may be one example of a detailed exemplary embodiment of the SR apparatus 100 discussed above. In this example, the SR receiver 200 comprises an antenna 210, a band pass filter (BPF) 208, a plurality of input isolation amplifiers 204-1 through 204-N, a plurality of SR amplifiers 202-1 through 202-N, a plurality of output isolation amplifiers 206-1 through 206-N, and a summing device 212.

More specifically, the band pass filter (BPF) 208 is coupled between the antenna 210 and the inputs of the plurality of input isolation amplifiers 204-1 through 204-N. The outputs of the input isolation amplifiers 204-1 through 204-N are coupled respectively to the inputs of the SR amplifiers 202-1 through 202-N. The outputs of the SR amplifiers 202-1 through 202-N are coupled respectively to the inputs of the output isolation amplifiers 206-1 through 206-N. The outputs of the output isolation amplifiers 206-1 through 206-N are coupled to the input of the summing device 212.

The antenna 210 receives the intended signal and possibly out-of-band and/or in-band jamming signals. The band pass filter (BPF) 208 provides an initial filtering of the received signals mainly to reduce or eliminate out-of-band jamming signals at the inputs of the input isolation amplifiers 204-1 through 204-N. Since, as discussed above, the SR amplifiers 202-1 through 202-N have inherent out-of-band rejection characteristics, the filtering specification for the band pass filter (BPF) 208 may be relaxed. Alternatively, the band pass filter (BPF) 208 may be eliminated altogether.

The input and output isolation amplifiers isolate the SR amplifiers from each other. This is to prevent injection locking of one SR amplifier to another. Additionally, the input isolation amplifiers also assist in preventing power leaking from the SR amplifiers to the antenna. Otherwise, this may generate unwanted radiation, which may result in a violation of governmental laws, rules or regulations that govern the control of electromagnetic radiation emissions. The parallel SR amplifiers 202-1 through 202-N respectively amplify the corresponding frequency components of the received signal within the distinct frequency bands, respectively. The summing device 212 reconstructs the amplified received signal from the corresponding frequency components received respectively from the outputs of the output isolation amplifiers 206-1 through 206-N.

As discussed above with reference to the previous embodiments, the SR amplifiers 202-1 through 202-N are tuned to distinct frequency bands having respective center frequencies represented as f1 to fN. The distinct frequency bands may reside within a defined bandwidth, such as an ultra-wide band (UWB) channel. The number N of SR amplifiers, the respective quality factors (Q) of the SR amplifiers, and the respective center frequencies f1 to fN of the distinct frequency bands may be configured to provide a defined minimum gain, a defined gain ripple, or a defined frequency response across the defined bandwidth. This is better explained with reference to the exemplary graph depicted in FIG. 2B.

Figure 2B:
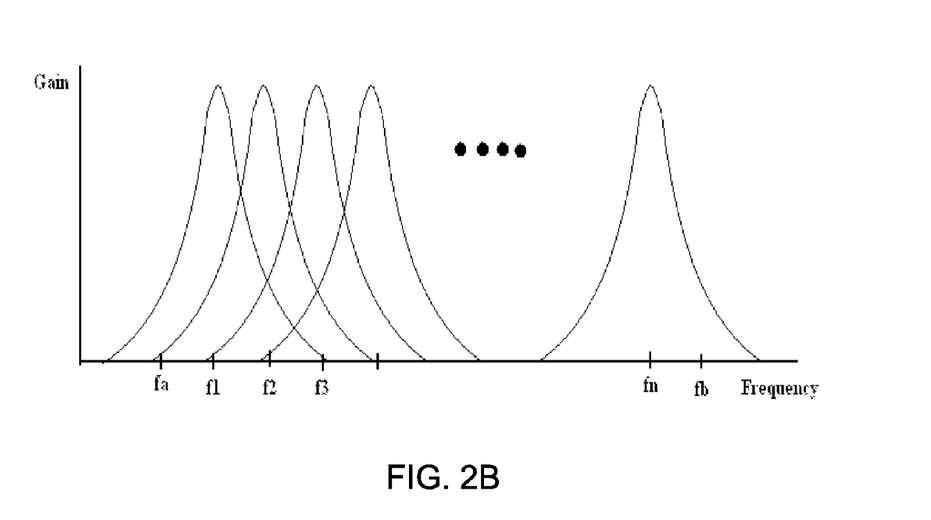
FIG. 2B illustrates a graph of an exemplary frequency response pertaining to the exemplary super regenerative (SR) receiver in accordance with another aspect of the disclosure.

FIG. 2B illustrates a graph of an exemplary frequency response pertaining to the exemplary super regenerative (SR) receiver 200 in accordance with another aspect of the disclosure. The x- or horizontal axis of the graph represents the frequency. The y- or vertical axis represents gain. As the graph illustrates, the defined bandwidth ranges from a relatively low frequency represented as fa to a relatively high frequency represented as fb. The graph also shows the frequency responses of the respective SR amplifiers 202-1 through 202-N. For example, the left-most frequency response having a center frequency of f1 pertains to the SR amplifier 202-1. Similarly, the frequency response having a center frequency of f2 pertains to the SR amplifier 202-2. In a like manner, the frequency response having a center frequency of fn pertains to the SR amplifier 202-N.

Note that, in this example, the frequency responses of the SR amplifiers overlap with each other. This is done to provide an overall frequency response for the defined bandwidth. The center frequency governs the position of the individual frequency response within the defined bandwidth. The quality factor (Q) governs the width of the individual frequency response. For example, the higher quality factor (Q), the more narrow is the individual frequency response. Conversely, the lower quality factor (Q), the wider is the individual frequency response. Also, the number N of SR amplifiers affect the overall frequency response for the defined bandwidth. As discussed above, by properly selecting the number N of SR amplifiers, the respective quality factors (Q) of the SR amplifiers, and the respective center frequencies f1 to fN of the distinct frequency bands, a desired overall frequency response for the defined bandwidth may be achieved, which may include a defined minimum gain and/or a defined gain ripple.

Figure 3A:
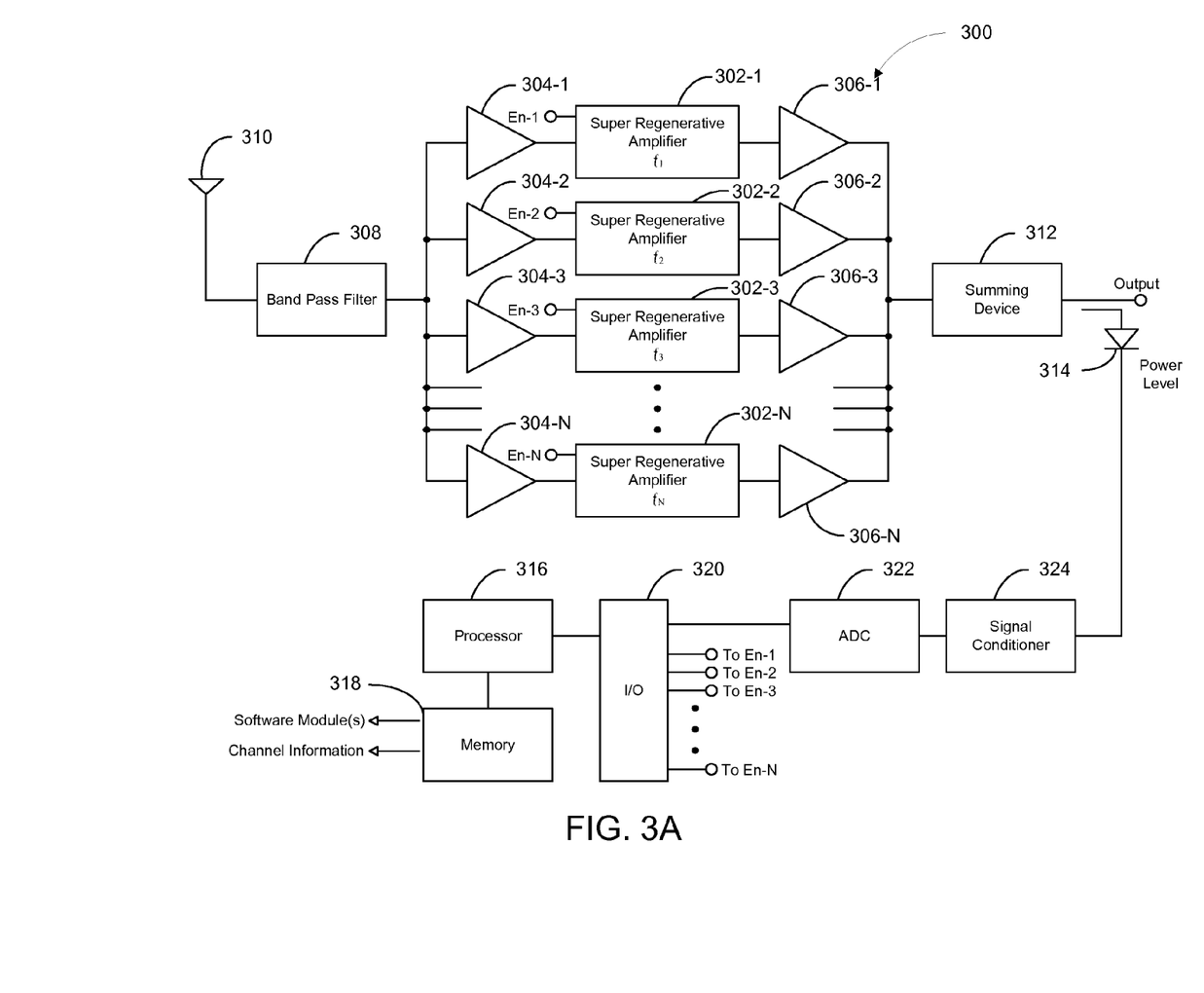
FIG. 3A illustrates a block diagram of an exemplary super regenerative (SR) receiver in accordance with another aspect of the disclosure.

FIG. 3A illustrates a block diagram of an exemplary super regenerative (SR) receiver 300 in accordance with another aspect of the disclosure. The SR receiver 300 is particularly configured to reduce or substantially reject in-band jamming signals. Similar to the previous embodiment 200, the SR receiver 300 comprises an antenna 310, a band pass filter (BPF) 308, a plurality of input isolation amplifiers 304-1 through 304-N, a plurality of SR amplifiers 302-1 through 302-N, a plurality of output isolation amplifiers 306-1 through 306-n, and a summing device 312. These items were discussed in detail above with reference to SR receiver 200.

The SR receiver 300 further comprises a power detector 314, a signal conditioner 324, an analog-to-digital converter (ADC) 322, an input/output (I/O) device 320, a processor 316, and a memory 318. The power detector 314 generates a signal indicative of the power level at the output of the SR receiver 300. The signal conditioner 324 modifies (e.g., amplifies, filters, etc.) the signal from the power detector 314 so it is at an appropriate level with reduced noise for conversion into digital format. The ADC 322 converts the conditioned signal into digital format, which is subsequently sent to the processor 316 via the I/O device 320 for analysis. The I/O device 320 receives the signal from the ADC 322 and passes it to the processor 316, as well as passes enable/disable signals En-1 through En-N from the processor 316 respectively to the SR amplifiers 302-1 through 302-N.

The processor 316 performs the various operations described hereinafter to reduce or substantially eliminate in-band jamming signals. The memory 316, which could be any type of computer readable medium, such as random access memory (RAM), read only memory (ROM), magnetic disk, optical disc, and variations thereof, stores one or more software modules that controls the processor 316 in performing its various operations. The memory 318 may store data as well, such as information as to which channels or SR amplifiers are enabled and which channels or SR amplifiers are disabled to reduce or eliminate in-band jamming signals. The following describes an exemplary method performed by the processor 316 for dealing with in-band jamming signals.

Figure 3B:
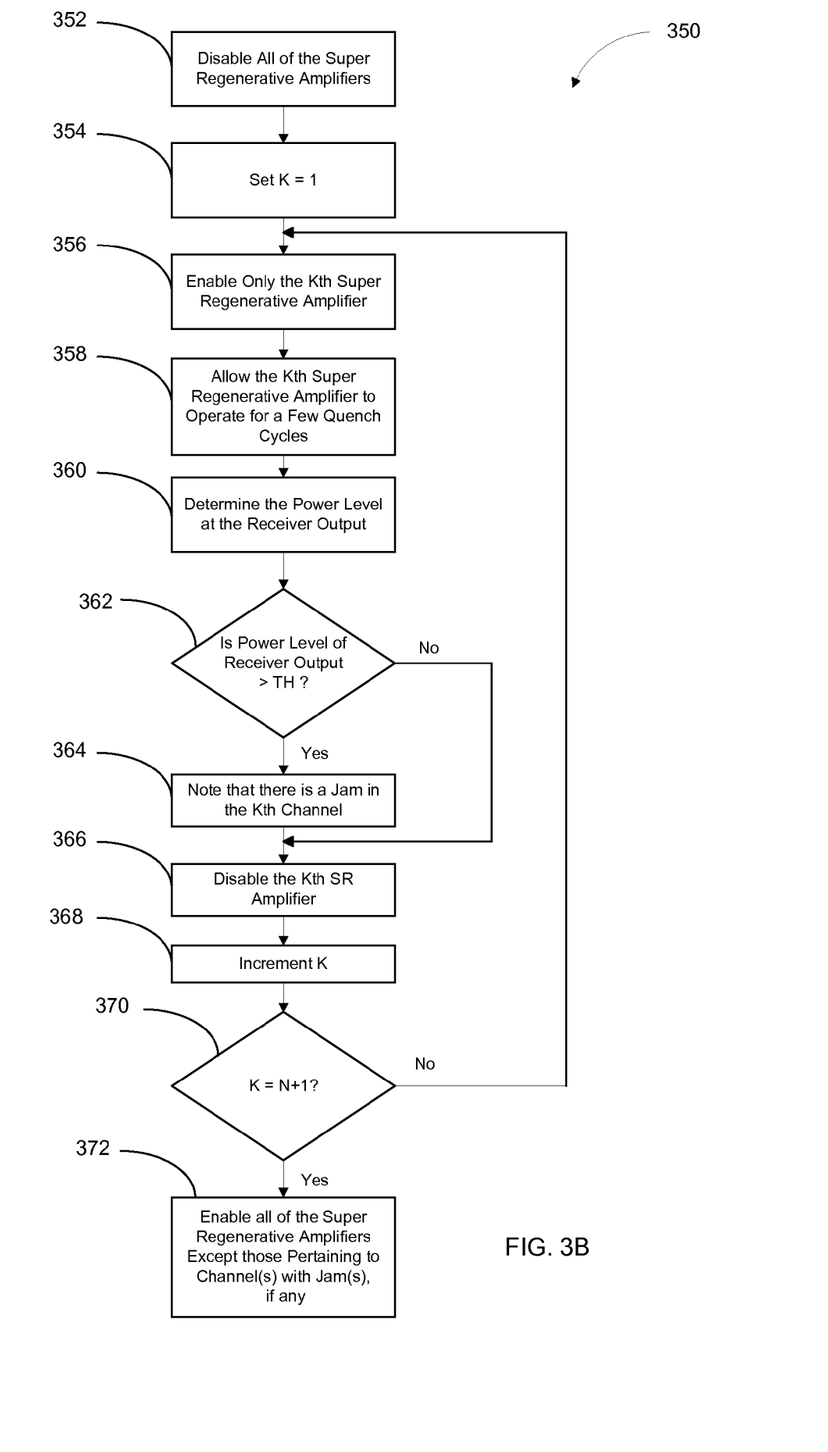
FIG. 3B illustrates a flow diagram of an exemplary method of reducing and/or eliminating in-band jamming signals from the output of the exemplary super regenerative (SR) receiver in accordance with another aspect of the disclosure.

FIG. 3B illustrates a flow diagram of an exemplary method 350 of reducing and/or eliminating in-band jamming signals from the output of the exemplary super regenerative (SR) receiver 300 in accordance with another aspect of the disclosure. It is presumed that at the time of the method 350, the corresponding communications device including the SR receiver 300 is not in communication with another device. Thus, during the operation of the method 350, substantially no intended in-band signals are being received by the SR receiver 300.

According to the method 350, the processor 316 disables the SR amplifiers 302-1 through 302-N (block 352). The processor 316 may perform the disabling of the SR amplifiers 302-1 through 302-N by sending the appropriate disabling signals thereto respectively via the En-1 through En-N. The processor 316 then sets an index K to 1 (block 354). The index K identifies the SR amplifier 302-K which will be currently checked to determine whether it is amplifying an in-band jamming signal. The processor 316 then enables the Kth SR amplifier (block 356). The processor 316 may perform the enabling of the Kth SR amplifier by sending the appropriate enabling signal En-K to the SR amplifier 302-K. For example, if K is equal to 1, the processor 316 enables SR amplifier 302-1. As discussed above, the rest of the SR amplifiers 302-2 through 302-N have been disabled.

Then, according to the method 350, the SR amplifier 302-K is allowed to operate for a few quench cycles (block 358). This is to allow the SR amplifier 302-K to sufficiently stabilize for the purposes of monitoring the output of the SR receiver 300 for in-band jamming signals. The processor 316 then determines the power level at the output of the SR receiver 300 (block 360). As discussed above, the processor 316 may determine the output power level by monitoring the signal received from the ADC 322. The processor 316 then determines whether the power level of the receiver output is greater than a defined threshold (block 362). The defined threshold may be related to the power level produced by ambient noise. One method of determining the defined threshold is to disconnect the antenna 310 and connect therefore a 50 Ohm termination. The corresponding value at the output of the ADC 322 may then be used as the defined threshold. Alternatively, the defined threshold may be determined by measuring the ambient temperature with a temperature sensor, and then using a look-up table to map the sensed temperature to the defined threshold. If the processor 316 determines that the power level of the receiver output is greater than the defined threshold, the processor 316 notes that there is a jamming signal in the Kth channel (block 364). The processor 316 then disables the SR amplifier 302-K as specified in block 366.

If the power level at the receiver output is below the defined threshold, the processor 316 skips block 364 and disables the SR amplifier 302-K (block 366). The processor 316 may perform this by sending the appropriate disabling signal En-K to the SR amplifier 302-K. The processor 316 then increments the index K to select the next SR amplifier to undergo the in-band jamming signal check (block 368). The processor 316 then checks whether the index K is equal to N+1 (block 370). If it is, which means that all of the SR amplifiers have been checked for in-band jamming signals, the processor 316 then enables all of the SR amplifiers, except those identified in block 364 as having an in-band jamming signal. If, in block 370, the index K does not equal to N+1, the processor 316 then returns to block 356 to perform the in-band jamming signal check for the next SR amplifier. Thus, according to the method 350, any SR amplifier that amplifies an in-band jamming signal is disabled in order to prevent the in-band jamming signal from propagating to the output of the SR receiver 300. If the number N of SR amplifiers is chosen to be relatively large, the effects on the overall frequency response due to a small number of SR amplifiers being disabled should be small.

Figure 4:
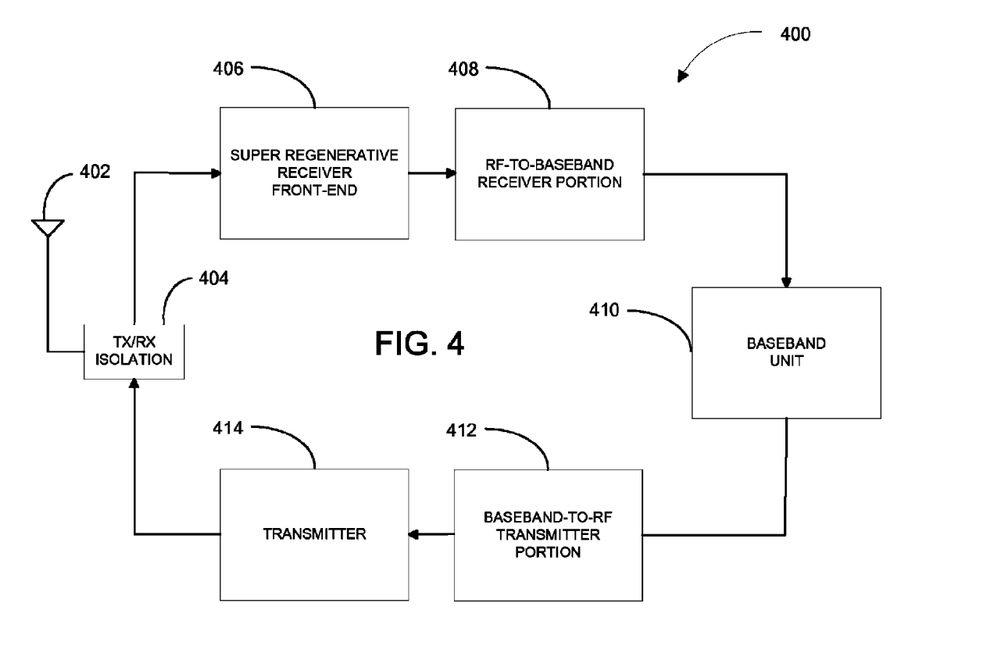
FIG. 4 illustrates a block and schematic diagram of an exemplary communications device in accordance with another aspect of the disclosure.

FIG. 4 illustrates a block diagram of an exemplary communications device 400 that includes an SR receiver front-end in accordance with another aspect of the disclosure. The communications device 400 comprises an antenna 402, a transmitter/receiver (Tx/Rx) isolation device 404, an SR receiver front-end 406, an RF-to-baseband receiver portion 408, a baseband unit 410, a baseband-to-RF transmitter portion 412, and a transmitter 414. The antenna 402 serves to receive signals from other communications devices via a wireless medium, and to send signals to other communications devices via the wireless medium. The Tx/Rx isolation device 404 serves to isolate the input of the SR receiver front-end 406 from the relatively large power of the signal generated by the transmitter 414 during transmission of signals to other communications device.

As discussed above, the SR receiver front-end 406 receives and amplifies signals received from other communications devices. The RF-to-baseband receiver portion 408 converts the received signal from RF to baseband for further processing by the baseband unit 410. The RF-to-baseband receiver portion 408 may be configured as a non-coherent receiver, such as an energy-detection receiver. The baseband unit 410 processes the baseband signal to ascertain the information carried therein. The baseband-to-RF transmitter portion 412 converts outgoing signals generated by the baseband unit 410 into RF for transmission via the wireless medium. The transmitter 414 conditions the outgoing signal (e.g., by power amplifying, pulse modulating, etc.) for transmission of the outgoing signals to other communications devices via the wireless medium.

Although not shown, the receiver 406 and/or 408 may be controlled by a pulse modulating device in order to establish a receiving communications channel (e.g., an ultra-wide band (UWB) communications channel) using pulse division multiple access (PDMA), pulse division multiplexing (PDM), or other type of pulse modulation. Although not shown, the transmitter 412 and/or 414 may be controlled by a pulse modulating device to enable signal transmission at particular instances defined by pulses in order to establish a transmitting communications channel (e.g., an ultra-wide band (UWB) communications channel) using PDMA, PDM, or other type of pulse modulation. The transmitting and receiving channels may be established concurrently, although the channels may be orthogonal so as not to interfere with each other. Using pulse modulation techniques to enable and disable the transmitter and receiver, improved power efficiency may be achieved for the communications device 400. For example, during times when the transmitter is not transmitting and the receiver is not receiving, these devices may be operated in low or no power mode to conserve power, such as power provided by a battery.

Figure 5A:
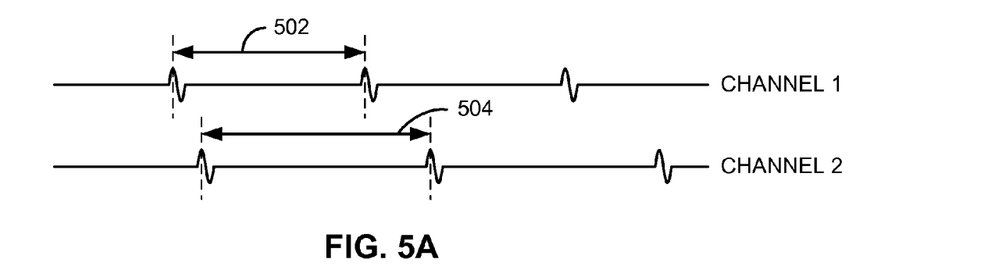
FIGS. 5A-D illustrate timing diagrams of various pulse modulation techniques in accordance with another aspect of the disclosure.

FIG. 5A illustrates different channels (channels 1 and 2) defined with different pulse repetition frequencies (PRF) as an example of a PDMA modulation. Specifically, pulses for channel 1 have a pulse repetition frequency (PRF) corresponding to a pulse-to-pulse delay period 502. Conversely, pulses for channel 2 have a pulse repetition frequency (PRF) corresponding to a pulse-to-pulse delay period 504. This technique may thus be used to define pseudo-orthogonal channels with a relatively low likelihood of pulse collisions between the two channels. In particular, a low likelihood of pulse collisions may be achieved through the use of a low duty cycle for the pulses. For example, through appropriate selection of the pulse repetition frequencies (PRF), substantially all pulses for a given channel may be transmitted at different times than pulses for any other channel.

The pulse repetition frequency (PRF) defined for a given channel may depend on the data rate or rates supported by that channel. For example, a channel supporting very low data rates (e.g., on the order of a few kilobits per second or Kbps) may employ a corresponding low pulse repetition frequency (PRF). Conversely, a channel supporting relatively high data rates (e.g., on the order of a several megabits per second or Mbps) may employ a correspondingly higher pulse repetition frequency (PRF).

Figure 5B:
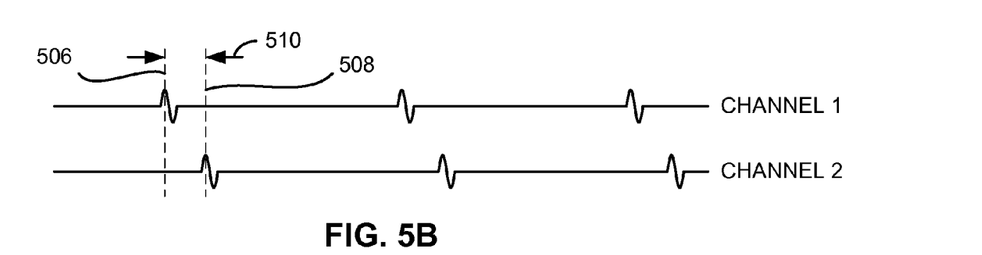

FIG. 5B illustrates different channels (channels 1 and 2) defined with different pulse positions or offsets as an example of a PDMA modulation. Pulses for channel 1 are generated at a point in time as represented by line 506 in accordance with a first pulse offset (e.g., with respect to a given point in time, not shown). Conversely, pulses for channel 2 are generated at a point in time as represented by line 508 in accordance with a second pulse offset. Given the pulse offset difference between the pulses (as represented by the arrows 510), this technique may be used to reduce the likelihood of pulse collisions between the two channels. Depending on any other signaling parameters that are defined for the channels (e.g., as discussed herein) and the precision of the timing between the devices (e.g., relative clock drift), the use of different pulse offsets may be used to provide orthogonal or pseudo-orthogonal channels.

Figure 5C:
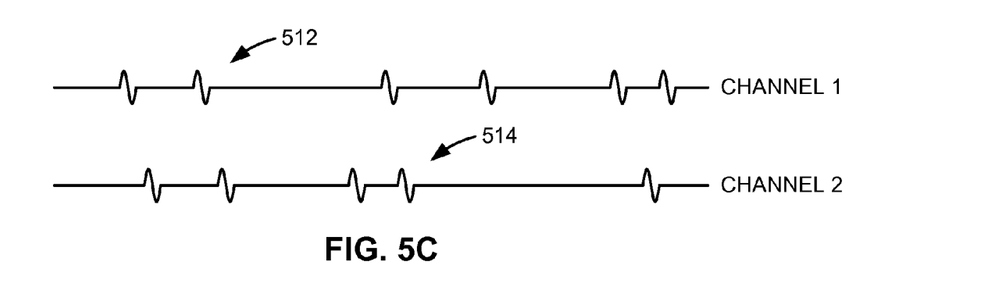

FIG. 5C illustrates different channels (channels 1 and 2) defined with different timing hopping sequences. For example, pulses 512 for channel 1 may be generated at times in accordance with one time hopping sequence while pulses 514 for channel 2 may be generated at times in accordance with another time hopping sequence. Depending on the specific sequences used and the precision of the timing between the devices, this technique may be used to provide orthogonal or pseudo-orthogonal channels. For example, the time hopped pulse positions may not be periodic to reduce the possibility of repeat pulse collisions from neighboring channels.

Figure 5D:
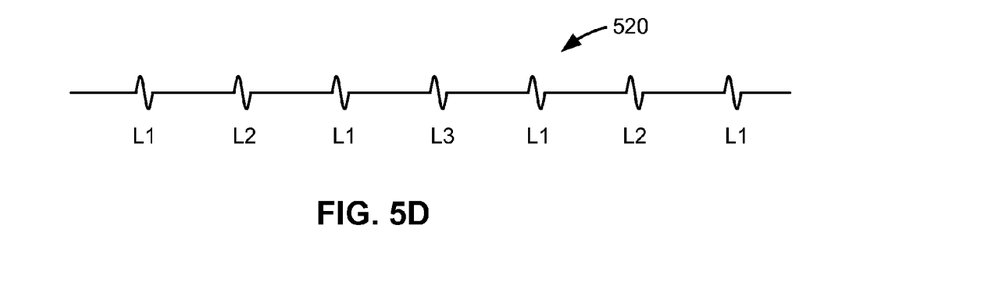

FIG. 5D illustrates different channels defined with different time slots as an example of a PDM modulation. Pulses for channel L1 are generated at particular time instances. Similarly, pulses for channel L2 are generated at other time instances. In the same manner, pulse for channel L3 are generated at still other time instances. Generally, the time instances pertaining to the different channels do not coincide or may be orthogonal to reduce or eliminate interference between the various channels.

It should be appreciated that other techniques may be used to define channels in accordance with a pulse modulation schemes. For example, a channel may be defined based on different spreading pseudo-random number sequences, or some other suitable parameter or parameters. Moreover, a channel may be defined based on a combination of two or more parameters.

Figure 6:
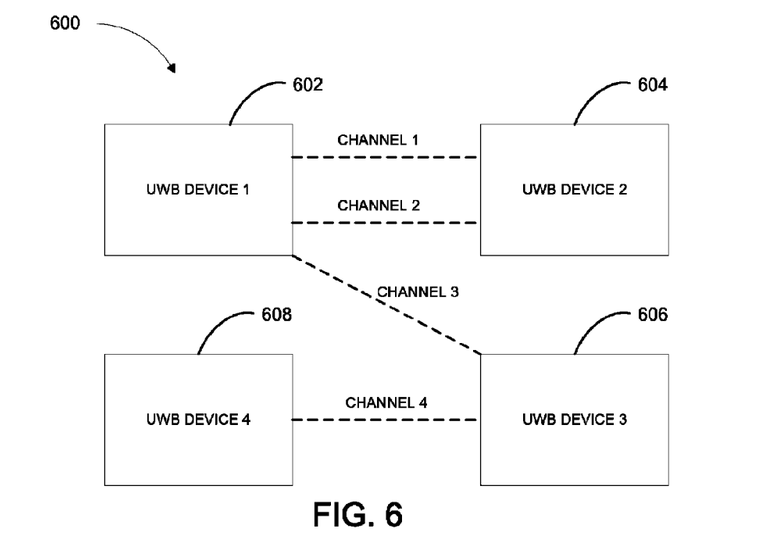
FIG. 6 illustrates a block diagram of various communications devices communicating with each other via various channels in accordance with another aspect of the disclosure.

FIG. 6 illustrates a block diagram of various ultra-wide band (UWB) communications devices communicating with each other via various channels in accordance with another aspect of the disclosure. For example, UWB device 1 602 is communicating with UWB device 2 604 via two concurrent UWB channels 1 and 2. UWB device 602 is communicating with UWB device 3 606 via a single channel 3. And, UWB device 3 606 is, in turn, communicating with UWB device 4 608 via a single channel 4. Other configurations are possible. The communications devices may be used for many different applications, and may be implemented, for example, in a headset, microphone, biometric sensor, heart rate monitor, pedometer, EKG device, watch, remote control, switch, tire pressure monitor, or other communications devices.

Figure 7:
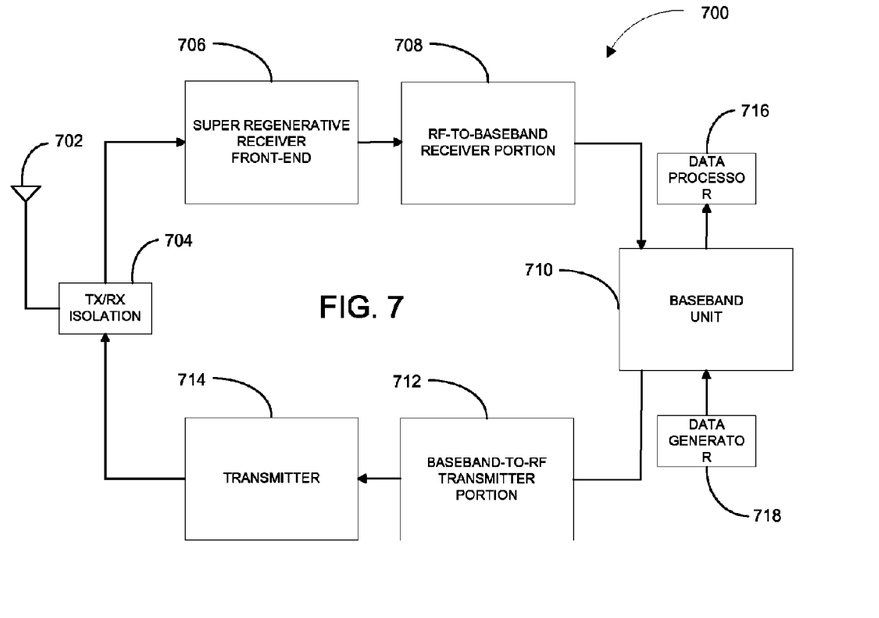
FIG. 7 illustrates a block diagram of an exemplary communications device including an exemplary transceiver in accordance with another aspect of the disclosure.

FIG. 7 illustrates a block diagram of an exemplary communications device 700 including an exemplary transceiver in accordance with another aspect of the disclosure. The communications device 700 may be particularly suited for sending and receiving data to and from other communications devices. The communications device 700 comprises an antenna 702, a Tx/Rx isolation device 704, an SR receiver front-end 706, an RF-to-baseband receiver portion 708, a baseband unit 710, a baseband-to-RF transmitter portion 712, a transmitter 714, a data processor 716, and a data generator 718.

In operation, the data processor 716 may receive data from other communications device via the antenna 702 which picks up the RF signal from the other communications device, the Tx/Rx isolation device 704 which sends the signal to the SR receiver front-end 706, the SR receiver front-end 706 which amplifies the received signal, the RF-to-baseband receiver portion 708 which converts the RF signal into a baseband signal, and the baseband unit 710 which processes the baseband signal to determine the received data. The data processor 716 then performs one or more defined operations based on the received data. For example, the data processor 716 may include a microprocessor, a microcontroller, a reduced instruction set computer (RISC) processor, a display, an audio device including a transducer such as speakers, a medical device, a robotic or mechanical device responsive to the data, etc.

Further, in operation, the data generator 718 may generate outgoing data for transmission to another communications device via the baseband unit 710 which processes the outgoing data into a baseband signal for transmission, the baseband-to-RF transmitter portion 712 converts the baseband signal into an RF signal, the transmitter 714 conditions the RF signal for transmission via the wireless medium, the Tx/Rx isolation device 704 which routes the RF signal to the antenna 702 while isolating the input to the SR receiver front-end 706, and the antenna 702 which radiates the RF signal to the wireless medium. The data generator 718 may be a sensor or other type of data generator. For example, the data generator 718 may include a microprocessor, a microcontroller, a RISC processor, a keyboard, a pointing device such as a mouse or a track ball, an audio device including a transducer such as a microphone, a medical device, a robotic or mechanical device that generates data, etc.

Figure 8:
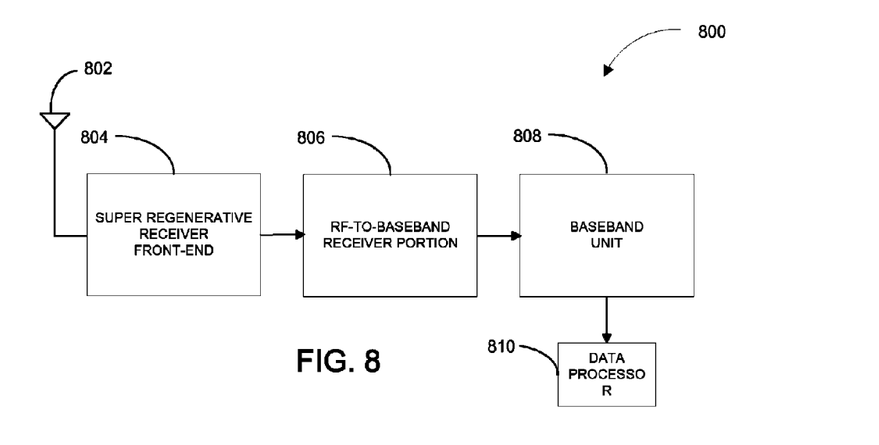
FIG. 8 illustrates a block diagram of an exemplary communications device including an exemplary receiver in accordance with another aspect of the disclosure.

FIG. 8 illustrates a block diagram of an exemplary communications device 800 including an exemplary receiver in accordance with another aspect of the disclosure. The communications device 800 may be particularly suited for receiving data from other communications devices. The communications device 800 comprises an antenna 802, an SR receiver front-end 804, an RF-to-baseband receiver portion 806, a baseband unit 808, and a data processor 810.

In operation, the data processor 810 may receive data from other communications device via the antenna 802 which picks up the RF signal from the other communications device, the SR receiver front-end 804 which amplifies the received signal, the RF-to-baseband receiver portion 806 which converts the RF signal into a baseband signal, and the baseband unit 808 which processes the baseband signal to determine the received data. The data processor 810 then performs one or more defined operations based on the received data. For example, the data processor 810 may include a microprocessor, a microcontroller, a RISC processor, a display, an audio device including a transducer, such as speakers, a medical device, a robotic or mechanical device responsive to the data, etc.

Figure 9:
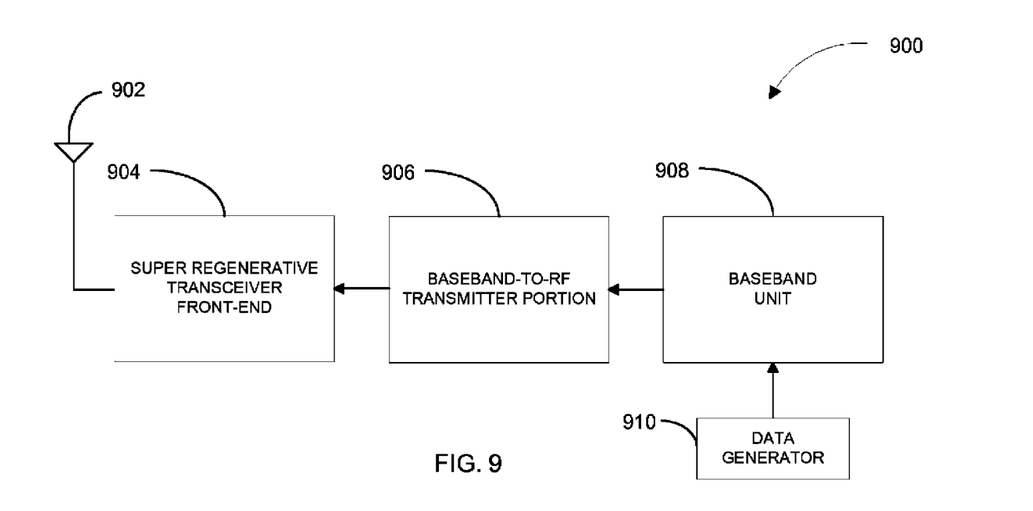
FIG. 9 illustrates a block diagram of an exemplary communications device including an exemplary transceiver in accordance with another aspect of the disclosure.

FIG. 9 illustrates a block diagram of an exemplary communications device 900 including an exemplary transceiver in accordance with another aspect of the disclosure. The communications device 900 may be particularly suited for sending data to other communications devices. The communications device 900 comprises an antenna 902, an SR transceiver front-end 904, a baseband-to-RF transmitter portion 906, a baseband unit 908, and a data generator 910.

In operation, the data generator 910 may generate outgoing data for transmission to another communications device via the baseband unit 908 which processes the outgoing data into a baseband signal for transmission, the baseband-to-RF transmitter portion 906 which converts the baseband signal into an RF signal, the transceiver 904 which conditions the RF signal for transmission via the wireless medium, and the antenna 902 which radiates the RF signal to the wireless medium. The data generator 910 may be a sensor or other type of data generator. For example, the data generator 910 may include a microprocessor, a microcontroller, a RISC processor, a keyboard, a pointing device such as a mouse or a track ball, an audio device including a transducer such as a microphone, a medical device, a robotic or mechanical device that generates data, etc.

Various aspects of the disclosure have been described above. It should be apparent that the teachings herein may be embodied in a wide variety of forms and that any specific structure, function, or both being disclosed herein is merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. As an example of some of the above concepts, in some aspects concurrent channels may be established based on pulse repetition frequencies. In some aspects concurrent channels may be established based on pulse position or offsets. In some aspects concurrent channels may be established based on time hopping sequences. In some aspects concurrent channels may be established based on pulse repetition frequencies, pulse positions or offsets, and time hopping sequences.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, processors, means, circuits, and algorithm steps described in connection with the aspects disclosed herein may be implemented as electronic hardware (e.g., a digital implementation, an analog implementation, or a combination of the two, which may be designed using source coding or some other technique), various forms of program or design code incorporating instructions (which may be referred to herein, for convenience, as "software" or a "software module"), or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented within or performed by an integrated circuit ("IC"), an access terminal, or an access point. The IC may comprise a general purpose processor, a digital signal processor (DSP), an application specific integrated circuit (ASIC), a field programmable gate array (FPGA) or other programmable logic device, discrete gate or transistor logic, discrete hardware components, electrical components, optical components, mechanical components, or any combination thereof designed to perform the functions described herein, and may execute codes or instructions that reside within the IC, outside of the IC, or both. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is understood that any specific order or hierarchy of steps in any disclosed process is an example of a sample approach. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

The steps of a method or algorithm described in connection with the aspects disclosed herein may be embodied directly in hardware, in a software module executed by a processor, or in a combination of the two. A software module (e.g., including executable instructions and related data) and other data may reside in a data memory such as RAM memory, flash memory, ROM memory, EPROM memory, EEPROM memory, registers, a hard disk, a removable disk, a CD-ROM, or any other form of computer-readable storage medium known in the art. A sample storage medium may be coupled to a machine such as, for example, a computer/processor (which may be referred to herein, for convenience, as a "processor") such the processor can read information (e.g., code) from and write information to the storage medium. A sample storage medium may be integral to the processor. The processor and the storage medium may reside in an ASIC. The ASIC may reside in user equipment. In the alternative, the processor and the storage medium may reside as discrete components in user equipment. Moreover, in some aspects any suitable computer-program product may comprise a computer-readable medium comprising codes relating to one or more of the aspects of the disclosure. In some aspects a computer program product may comprise packaging materials.

While the invention has been described in connection with various aspects, it will be understood that the invention is capable of further modifications. This application is intended to cover any variations, uses or adaptation of the invention following, in general, the principles of the invention, and including such departures from the present disclosure as come within the known and customary practice within the art to which the invention pertains.

What is claimed is:

1. An apparatus for wireless communication comprising a plurality of super regenerative amplifiers coupled in parallel, wherein the super regenerative amplifiers are tuned to respective distinct frequency bands, and further wherein the number N of super regenerative amplifiers, the respective quality factors (Q) of the super regenerative amplifiers, and the respective center frequencies ($f_c$) of the distinct frequency bands are configured to provide a defined minimum gain, a defined gain ripple, or a defined frequency response across a defined bandwidth.

2. The apparatus of claim 1, wherein the distinct frequency bands lie within the defined bandwidth.

3. The apparatus of claim 1, wherein one or more of the distinct frequency bands overlap with at least another of the one or more distinct frequency bands.

4. The apparatus of claim 1, further comprising a plurality of isolation amplifiers coupled respectively to inputs of the super regenerative amplifiers.

5. The apparatus of claim 1, further comprising a plurality of isolation amplifiers coupled respectively to outputs of the respective super regenerative amplifiers.

6. The apparatus of claim 1, further comprising a filter coupled to inputs of the super regenerative amplifiers.

7. The apparatus of claim 1, further comprising an antenna coupled to inputs of the super regenerative amplifiers.

8. The apparatus of claim 1, further comprising a summing device coupled to outputs of the super regenerative amplifiers.

9. The apparatus of claim 1, further comprising a circuit adapted to determine whether a jamming signal is present in any of the distinct frequency bands.

10. The apparatus of claim 9, wherein the circuit is further adapted to disable one or more super regenerative amplifiers pertaining respectively to one or more distinct frequency bands in which one or more jamming signals are present.

11. The apparatus of claim 9, wherein the circuit comprises a processor adapted to be controlled by executable codes.

12. The apparatus of claim 1, wherein the super regenerative amplifiers form at least a portion of a receiver.

13. The apparatus of claim 1, wherein the super regenerative amplifiers form at least a portion of a transceiver.

14. The apparatus of claim 1, wherein the super regenerative amplifiers form at least a portion of a non-coherent receiver.

15. The apparatus of claim 1, wherein the distinct frequency bands lie within a defined ultra-wide band channel that has a fractional bandwidth on the order of 20% or more, has a bandwidth on the order of 500 MHz or more, or has a fractional bandwidth on the order of 20% or more and has a bandwidth on the order of 500 MHz or more.

16. A method of wireless communication comprising:
coupling a plurality of super regenerative amplifiers in parallel;
tuning the super regenerative amplifiers to respective distinct frequency bands;
selecting the number N of super regenerative amplifiers;
selecting the respective quality factors (Q) of the super regenerative amplifiers; and
selecting the respective center frequencies ($f_c$) of the super regenerative amplifiers;
wherein N, and the respective Q and $f_c$ are selected to provide a minimum gain, a defined gain ripple or a defined frequency response across a defined bandwidth.

17. The method of claim 16, wherein the distinct frequency bands lie within the defined bandwidth.

18. The method of claim 16, wherein one or more of the distinct frequency bands overlap with at least another of the one or more distinct frequency bands.

19. The method of claim 16, further comprising electrically isolating inputs of the respective super regenerative amplifiers from each other.

20. The method of claim 16, further comprising electrically isolating outputs of the respective super regenerative amplifiers from each other.

21. The method of claim 16, further comprising:
amplifying a signal with the super regenerative amplifiers; and
filtering the signal prior to amplifying the signal with the super regenerative amplifiers.

22. The method of claim 16, further comprising:
receiving a signal via an antenna; and
amplifying the signal with the super regenerative amplifiers.

23. The method of claim 16, further comprising summing outputs of the super regenerative amplifiers.

24. The method of claim 16, further comprising determining whether a jamming signal is present in any of the distinct frequency bands.

25. The method of claim 24, further comprising disabling one or more super regenerative amplifiers pertaining respectively to one or more distinct frequency bands in which one or more jamming signals are present.

26. The method of claim 25, wherein the steps of determining whether a jamming signal is present and disabling one or more super regenerative amplifiers are performed by a processor.

27. The method of claim 16, further comprising receiving a signal via one or more of the super regenerative amplifiers.

28. The method of claim 16, further comprising transceiving signals using one or more super regenerative amplifiers.

29. The method of claim 16, further comprising receiving a signal in a non-coherent manner using one or more the super regenerative amplifiers.

30. The method of claim 16, wherein the distinct frequency bands lie within a defined ultra-wide band channel that has a fractional bandwidth on the order of 20% or more, has a bandwidth on the order of 500 MHz or more, or has a fractional bandwidth on the order of 20% or more and has a bandwidth on the order of 500 MHz or more.

31. An apparatus for wireless communication comprising:
means for coupling a plurality of super regenerative amplifiers in parallel;
means for tuning the super regenerative amplifiers to respective distinct frequency bands, wherein the number N of super regenerative amplifiers, the respective quality factors (Q) of the super regenerative amplifiers, and the center frequencies ($f_c$) of the distinct frequency bands are configured to provide a defined minimum gain, a defined gain ripple, or a defined frequency response across a defined bandwidth.

32. The apparatus of claim 31, wherein the distinct frequency bands lie within the defined bandwidth.

33. The apparatus of claim 31, wherein one or more of the distinct frequency bands overlap with at least another of the one or more distinct frequency bands.

34. The apparatus of claim 31, further comprising means for electrically isolating inputs of the respective super regenerative amplifiers from each other.

35. The apparatus of claim 31, further comprising means for electrically isolating outputs of the respective super regenerative amplifiers from each other.

36. The apparatus of claim 31, further comprising means for filtering the signal.

37. The apparatus of claim 31, further comprising means for receiving the signal.

38. The apparatus of claim 31, further comprising means for summing outputs of the super regenerative amplifiers.

39. The apparatus of claim 31, further comprising means for determining whether a jamming signal is present in any of the distinct frequency bands.

40. The apparatus of claim 39, further comprising means for disabling one or more super regenerative amplifiers pertaining respectively to one or more distinct frequency bands in which one or more jamming signals are present.

41. The apparatus of claim 40, wherein the means for determining whether a jamming signal is present and means for disabling one or more super regenerative amplifiers comprise a processor.

42. The apparatus of claim 31, further comprising means for receiving a signal using one or more of the super regenerative amplifiers.

43. The apparatus of claim 31, further comprising means for transceiving signals, wherein the means for transceiving signals comprises one or more super regenerative amplifiers.

44. The apparatus of claim 31, further comprising means for receiving a signal in a non-coherent manner using one or more of the super regenerative amplifiers.

45. The apparatus of claim 31, wherein the distinct frequency bands lie within a defined ultra-wide band channel that has a fractional bandwidth on the order of 20% or more, has a bandwidth on the order of 500 MHz or more, or has a fractional bandwidth on the order of 20% or more and has a bandwidth on the order of 500 MHz or more.

46. A computer program product for amplifying a signal comprising a non-transitory computer readable medium including codes executable by at least one computer to tune a plurality of super regenerative amplifiers coupled in parallel to respective distinct frequency bands, wherein the number N of super regenerative amplifiers, the respective quality factors (Q) of the super regenerative amplifiers, and the center frequencies ($f_c$) of the distinct frequency bands are configured to provide a defined minimum gain, a defined gain ripple, or a defined frequency response across a defined bandwidth.

47. A headset for wireless communications, comprising:
an antenna;
a receiver adapted to receive data via the antenna, wherein the receiver comprises a set of super regenerative amplifiers coupled in parallel, and further wherein the super regenerative amplifiers are tuned to respective distinct frequency bands, wherein the number N of super regenerative amplifiers, the respective quality factors (Q) of the super regenerative amplifiers, and the center frequencies ($f_c$) of the distinct frequency bands are configured to provide a defined minimum gain, a defined gain ripple, or a defined frequency response across a defined bandwidth; and
a transducer adapted to generate an audio output based on the received data.

48. A watch for wireless communications, comprising:
an antenna;
a receiver adapted to receive data via the antenna, wherein the receiver comprises a plurality of super regenerative amplifiers coupled in parallel, and further wherein the super regenerative amplifiers are tuned to respective distinct frequency bands, wherein the number N of super regenerative amplifiers, the respective quality factors (Q) of the super regenerative amplifiers, and the center frequencies ($f_c$) of the distinct frequency bands are configured to provide a defined minimum gain, a defined gain ripple, or a defined frequency response across a defined bandwidth; and
a display adapted to produce a visual output based on the received data.

49. A sensed device for wireless communications, comprising:
a sensor adapted to generate sensed data; and
a transceiver adapted to transmit the sensed data, wherein the transceiver comprises a plurality of super regenerative amplifiers coupled in parallel, and further wherein the super regenerative amplifiers are tuned to respective distinct frequency bands, wherein the number N of super regenerative amplifiers, the respective quality factors (Q) of the super regenerative amplifiers, and the center frequencies ($f_c$) of the distinct frequency bands are configured to provide a defined minimum gain, a defined gain ripple, or a defined frequency response across a defined bandwidth.

* * * * *